United States Patent
Lambkin et al.

(10) Patent No.: US 8,816,280 B2
(45) Date of Patent: Aug. 26, 2014

(54) INFRARED SENSOR

(75) Inventors: Paul Martin Lambkin, Cork (IE);
William Allan Lane, Cork (IE)

(73) Assignee: Analog Devices, Inc., Norwood, MA (US)

( * ) Notice: Subject to any disclaimer, the term of this patent is extended or adjusted under 35 U.S.C. 154(b) by 168 days.

(21) Appl. No.: 13/426,165

(22) Filed: Mar. 21, 2012

(65) Prior Publication Data
US 2013/0248711 A1 Sep. 26, 2013

(51) Int. Cl.
*H01L 25/00* (2006.01)
*G01J 5/10* (2006.01)

(52) U.S. Cl.
CPC .......................................... *G01J 5/10* (2013.01)
USPC ........................................................ 250/332

(58) Field of Classification Search
CPC .......................................................... G01J 5/10
USPC .............. 250/338.1–338.9, 340, 341.1–341.8
See application file for complete search history.

(56) References Cited

U.S. PATENT DOCUMENTS

| | | | | |
|---|---|---|---|---|
| 5,574,275 | A * | 11/1996 | Durst et al. | 250/208.2 |
| 5,795,069 | A | 8/1998 | Mattes et al. | |
| 6,155,711 | A | 12/2000 | Schaupert et al. | |
| 6,184,538 | B1 * | 2/2001 | Bandara et al. | 257/21 |
| 6,770,882 | B2 * | 8/2004 | Carr et al. | 250/338.1 |
| 7,435,964 | B2 | 10/2008 | Lane et al. | |
| 7,692,148 | B2 | 4/2010 | Lane et al. | |
| 7,718,967 | B2 | 5/2010 | Lane et al. | |
| 7,728,297 | B2 * | 6/2010 | Masafumi | 250/338.3 |
| 7,807,972 | B2 | 10/2010 | Lambkin et al. | |
| 7,847,253 | B2 * | 12/2010 | Carey et al. | 250/338.3 |
| 8,487,260 | B2 | 7/2013 | Lane et al. | |
| 8,523,427 | B2 | 9/2013 | Pillans | |
| 2002/0166968 | A1 * | 11/2002 | Bradley | 250/338.1 |
| 2003/0132386 | A1 * | 7/2003 | Carr et al. | 250/338.1 |
| 2009/0101821 | A1 * | 4/2009 | Masafumi | 250/338.3 |
| 2010/0030506 | A1 | 2/2010 | Cairnduff | |
| 2010/0038542 | A1 * | 2/2010 | Carey et al. | 250/338.4 |
| 2010/0198546 | A1 | 8/2010 | Kamata | |

FOREIGN PATENT DOCUMENTS

| | | |
|---|---|---|
| JP | 08-062055 | 3/1996 |
| JP | 2008-060155 | 3/2008 |
| JP | 2008-118502 | 5/2008 |

OTHER PUBLICATIONS

Gaalema et al., Final Report for topic A10a-T004 STTR entitled "MEMS based thermopile infrared detector array for chemical and biological sensing," conducted by Black Forest Engineering for U.S. Army Research Office, dated Apr. 20, 2011, 27 pages.

Hayat, Majeed M., et al., "Statistical Algorithm for Nonuniformity Correction in Focal-Plane Arrays," Applied Optics, vol. 38, No. 8, Mar. 10, 1999, p. 772-780.

Electrophysics Resource Center: Scientific Imaging. White Paper: Understanding Infrared Camera Thermal Image Quality. Edition: Nov. 2009 rev03, 2009, 12 pages.. Available at: www.electrophysics.com/e/dl-files/whitepapers_ph/WP-Ph-TIQ.pdf (Accessed, Dec. 7, 2012).

U.S. Appl. No. 13/434,075, filed Mar. 29, 2012, 28 pages.

(Continued)

*Primary Examiner* — Kiho Kim
(74) *Attorney, Agent, or Firm* — Knobbe, Martens, Olson & Bear LLP

(57) ABSTRACT

An infrared sensor, comprising at least one pixel comprising a first sensor and a second sensor, wherein the first and second sensors are dissimilar.

20 Claims, 9 Drawing Sheets

(56) References Cited

OTHER PUBLICATIONS

U.S. Appl. No. 13/692,748, filed Dec. 3, 2012, 23 pages.

Hsu et al., "A new approach of thermal type microsensor with photonic crystal," Instrumentation on Measurement Technology Conference (I2MTC), May 2010 IEEE, 4 pages.

* cited by examiner

INFRARED SENSOR

TECHNICAL FIELD

The present disclosure relates to infrared sensors, and in particular to arrays of such sensors.

BACKGROUND

It is known to provide infrared sensors in which a plurality of pixels are provided in an array. The pixels are sensitive to temperature, irrespective of whether the temperature change is a result of the ambient temperature around the pixel, for example the temperature of the substrate on which the pixel is provided, or whether the temperature results from infrared radiation impinging on and heating the pixel.

The changes in resistance as a result of a change in temperature can be very small, as can the temperature changes that are being measured. In order to resolve the small differences in resistance, it is known to compare the resistance of each of the temperature dependent resistors of a pixel of the infrared sensor with a reference resistor(s) which is not exposed to the incident infrared radiation, for example, in a Wheatstone bridge arrangement.

Whilst using a bridge or similar arrangement provides enhanced sensitivity to changes in resistance, it can also make the array of sensors vulnerable to mismatch between the resistors.

SUMMARY

According to a first aspect of the present invention there is provided an infrared sensor, comprising at least one pixel comprising a first sensor and a second sensor, wherein the first and second sensors are dissimilar.

It is thus possible to provide an improved infrared sensor in which offsets in the output versus temperature characteristic of the individual pixels of the sensor can be estimated and removed. The use of dissimilar sensors, which in this context means different implementing technologies, enables offsets in an output of a pixel to be estimated and corrected.

Preferably the first sensor comprises at least one temperature dependent resistor. Such resistors can be fabricated to give a relatively good signal sensitivity. In this context sensitivity means change of resistance and/or a change in voltage developed across the resistor in response to a change in temperature of the resistor.

Preferably the second sensor is or comprises at least one thermocouple. The thermocouple can be formed of any suitable material such as, without limitation, silicon and germanium, p-type semiconductor material in combination with n-type semiconductor material which may have a metal interface in between; polysilicon and titanium; or other suitable material combinations.

The use of a thermocouple provides a sensor for which an offset in its output versus temperature characteristic is very low.

In accordance with a number of embodiments an electronic circuit, or other processing means, is provided for using an output of the second sensor to compensate for imperfections, such as an offset or a gain error, in the output of the first sensor.

Advantageously the electronic circuit and the infrared sensor are provided in a single integrated circuit.

Advantageously a plurality of pixels can be provided in an array. An array of pixels in which the pixels are exposed to infrared radiation can be regarded as being an active array. Pixels may share reference resistors in a comparison arrangement. This can allow space to be saved by obviating the need to form a reference array of the same size as the active array.

According to a second aspect of the invention there is provided a method of compensating for pixel to pixel variation in an array of pixels, wherein each pixel in the array comprises a first sensor and a second sensor dissimilar to the first sensor, and wherein the outputs of the sensors are compared to identify at least offset errors in the output of the first sensor.

BRIEF DESCRIPTION OF THE DRAWINGS

The present invention will now be described, by way of non-limiting examples only, with reference to the accompanying drawings, in which.

DESCRIPTION OF EMBODIMENTS

Figure 1:
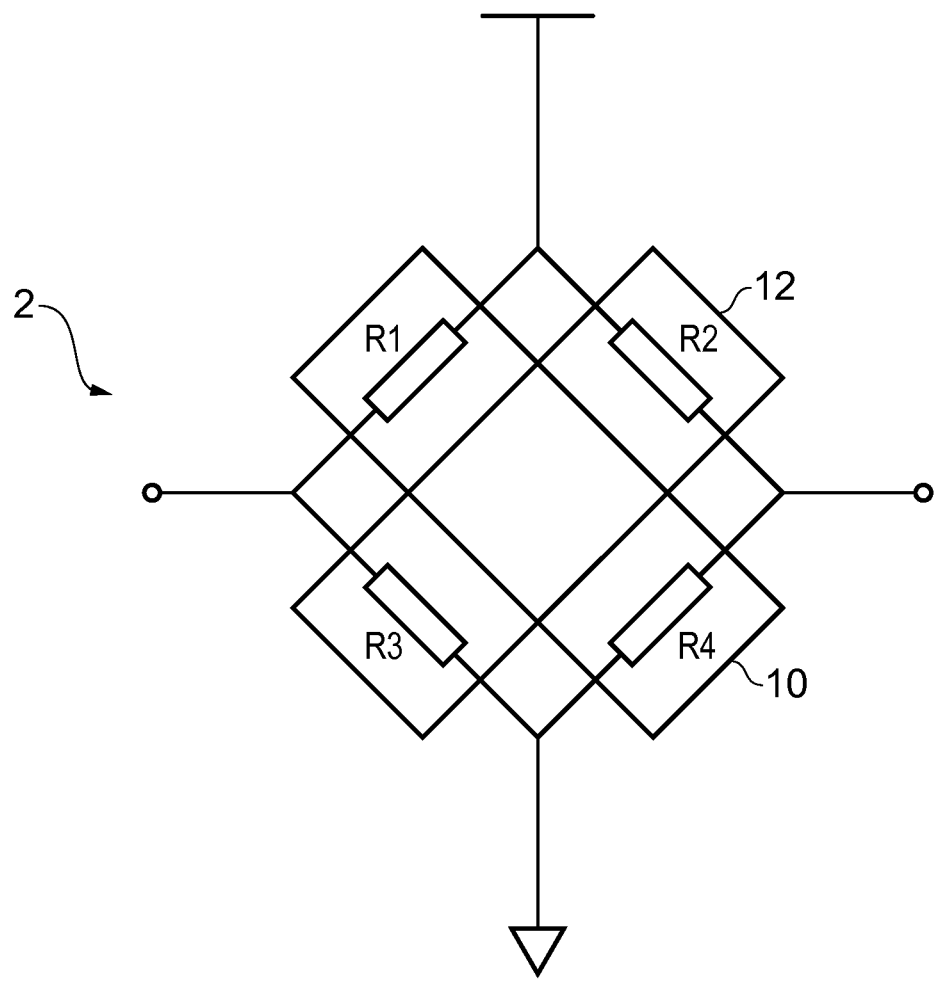
FIG. 1 is a schematic diagram of temperature dependant resistors in a Wheatstone bridge arrangement.

FIG. 1 schematically illustrates a Wheatstone bridge 2 comprising four temperature sensitive resistors, R1, R2, R3 and R4. Resistors R1 and R4 are positioned so as to be exposed to an incoming radiation flux, and can be regarded as forming a pixel of the infrared sensor, whereas resistors R2 and R3 are shielded from the radiation flux. As a result the temperature of the resistors R1 and R4 is a function of ambient temperature and the incoming infrared radiation, whereas the temperature of the resistors R2 and R3 is a function of the ambient temperature but not the incoming infrared radiation. All of the resistors R1 to R4 are subject to Joule heating whilst the Wheatstone bridge is energized.

Such an arrangement may be formed by providing resistors R1 and R4 as part of a first array 10 (an active array) of pixels, while resistors R2 and R3 are provided on a second shielded array 12 (a reference array). Resistors R1 and R4 of a given pixel which are exposed to infrared radiation can be placed in a Wheatstone bridge with matching resistors R2 and R3 from a corresponding cell in the shielded array 12. Thus a cell in the shielded array can be uniquely associated with a pixel in the active array and can be substantially identical to the pixel, except for the fact that the cell is shielded from the impinging infrared radiation.

Such an arrangement assumes that the resistance of the resistors are matched such that the resistance of R1 is substantially equal to that of R2; the resistance of resistor R3 is substantially equal to the resistance of R4 and that the temperature coefficients of resistance, TCR, are substantially the same.

In reality, even with modern integrated circuit manufacturing techniques, minor differences can exist between the notionally equivalent resistors due to imperfections in masking, etching or other process steps used to form the resistors.

Furthermore, it has been found that the TCR can also vary among the resistors. Without being bound to any theory, this may result from slight variations in the thermal contact between a resistor and its surroundings. Whilst these variations are small, they can limit the ultimate sensitivity of the infrared sensor to changes in temperature as the variations manifest themselves as unpredictable voltage offsets appearing across the Wheatstone bridge.

Figure 2:
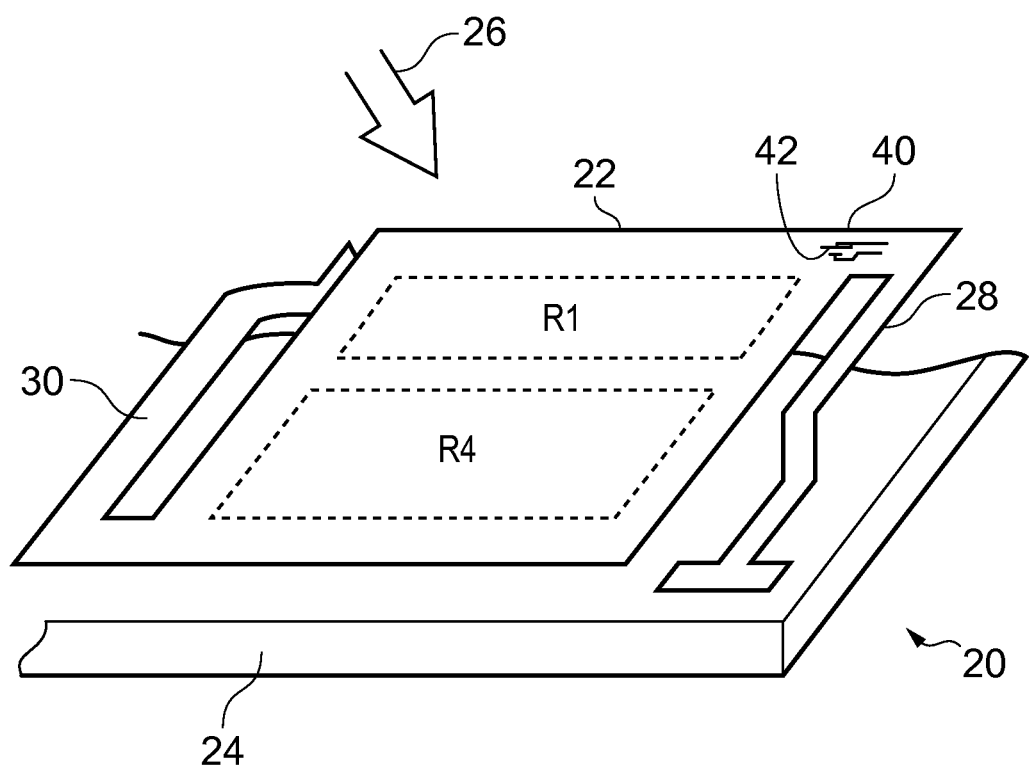
FIG. 2 is a schematic diagram of one pixel of an infrared sensor according to an embodiment of the present invention.

FIG. 2 schematically illustrates a pixel 20 of an infrared sensor constituting an embodiment of the present invention.

The pixel comprises a platform 22 formed above a substrate 24. The purpose of providing the platform 22 is to increase the thermal isolation between the resistors R1 and R4 deposited on the platform and the substrate 24 so that infrared radiation 26 impinging on the resistors R1 and R4 can maintain a temperature difference between that of the resistors R1 and R4 and that of the substrate 24. The first sensor can be regarded as comprising the resistors R1 and R4.

The platform 22 is attached to the substrate 24 via, in this example, two relatively long and thin arms 28 and 30 which serve to secure the platform to the substrate whilst also presenting an elongate thermal path that limits heat transfer between the platform 22 and the substrate 24.

Typically the platform 22 is formed by silicon micromachining techniques and can be very thin, giving it a low thermal mass. Formation of such a platform is known to the person skilled in the art and need not be described here. Thus, in some embodiments, the platform 22 can change temperature quite quickly, giving rise to response times that are acceptable for real time thermal imaging.

An integrated circuit that includes the pixel 20 is housed within an evacuated package (as is known to the person skilled in the art) such that heat transfer by convection is reduced or minimized.

The platform 22 supports the sensing components of the pixel 20. A similar platform may be formed to carry resistors R2 and R3 of the shielded array. Here the platform of the shielded array may be released from the substrate. Alternatively the platform may remain attached to the substrate, in which case the temperature of the platform is substantially the same as that of the substrate.

Where the pixel is to be used in a Wheatstone bridge sensing arrangement, the resistors R1 and R4 are deposited on the platform 22.

For illustrative purposes, resistors R1 and R4 have been drawn as being side by side, but preferably are formed by thin tracks that meander across the surface of the platform 22 such that each resistor has a presence in other portions of the surface of the platform 22, and can be regarded as occupying coincident areas of the platform.

Conductive tracks to and from the resistors R1 and R4 are formed on the elongate arms 28 and 30 such that a current can be supplied to the resistors R1 and R4 in order to measure the resistance of R1 and/or R4, and hence infer the temperature of the pixel and thereby contribute pixel data about a scene viewed by the pixel.

In the prior art it is known to provide a mechanical shutter that can be periodically moved in front of the pixels of the active array in order to provide a reference image. The reference image is a uniform image and the shutter is substantially at a prevailing ambient temperature.

Thus the image viewed by the active pixel array should be uniform when the shutter obscures the active pixel array. Any non-uniformities indicate mismatches between resistors R1 and R4 of a given pixel of the active pixels formed in one array and their counterparts, resistors R2 and R3, which are formed in the reference array and are shielded from the impinging infrared radiation associated with the imaged scene. The non-uniformities can be measured, and stored as offsets on a pixel by pixel basis.

Whilst such a technique can work quite well, the addition of a mechanical movable shutter is an unwelcome addition, in terms of cost, complexity and introduction of additional failure modes to what would otherwise be a solid state system.

The present disclosure allows the mechanical shutter to be dispensed with, whilst still providing a mechanism for assessing the variations in resistance of the pixel resistors that arise from manufacturing variations.

The removal of the mechanical shutter for calibration and offset cancellation purposes can be achieved by providing an additional sensor 40 on the pixel. The additional sensor 40 is dissimilar to the main sensor formed, in this example, by the temperature sensitive resistor R1 or resistors R1 and R4, such that its output versus temperature characteristics of the additional sensor differs from that of the main sensor.

In a preferred implementation the additional sensor, which can be regarded as a second sensor, is a thermocouple.

A thermocouple comprises a junction, and often two or more junctions between dissimilar conductors. A first one of the thermocouple junctions 42 of the thermocouple 40 is formed on the platform 22, whereas the second thermocouple junction (or as we will see later, second and third) is formed away from the platform 22, and conveniently can be formed over the substrate 24.

Each junction is a contact point between dissimilar conductors, but where two "cold junctions" are provided both cold junctions may use the same metal type for the formation of a connection to other circuitry.

In fact, as known to the person skilled in the art, the voltage in a thermocouple results not from the junction, but from the thermal gradient along the conductor, and is known as the Seebeck effect. The use of dissimilar materials having different Seebeck coefficients creates a circuit in which the materials generate two different voltages, the sum of which can then be measured.

The thermocouple may make a relatively poor sensor for the purposes of imaging the scene viewed by the infrared detector because the thermocouple has a low output voltage and hence its output signal has to compete with its own input referenced noise power and that of any subsequent signal processing circuit. However, the thermocouple has little offset, even taking dimensional changes due to manufacturing tolerances into account, and hence can be used as a reference for the purposes of correcting for offsets in the first sensors formed by the temperature dependent resistors, for example by R1 and R4 acting in a potential divider, or R1 to R4 cooperating to form a Wheatstone bridge as illustrated in FIG. 1. Furthermore the thermocouple does not have to be supplied with electrical energy to read it so does not, or at least need not, suffer from Joule heating.

The estimate of offset may be affected by noise, but successive averaging of the output of the thermocouple 40 and/or the estimate of offset itself allows the effects of noise to be reduced and increasingly good compensation to be performed without either the expense of providing a mechanical shutter or enduring "downtime" whilst the shutter obscures the pixels of the active sensor array.

In a typical sensor, the pixel 20 of FIG. 2 is fabricated into an array of pixels. Such arrays may be small, for example 3 pixels×3 pixels, for simple applications such as detecting passage of individuals through doorways to much bigger arrays for more complex security, fire detection or other thermal imaging applications.

For small arrays, a fully hidden reference array may be formed such that each pixel of the active array cooperates with a single associated pixel of the reference array in the formation of a Wheatstone bridge arrangement.

When the number of pixels increases with array size such an approach become progressively wasteful of circuit area. Under such circumstances a single row of cooperating pixels or indeed only a single pixel may be formed in the reference array and used in a time multiplexed manner to form a Wheatstone bridge, or other measurement circuit, with pixels from the active array. Consequently one cell in the reference array can cooperate with multiple pixels, one at a time, in the active array to form Wheatstone Bridge arrangements for the purposes of assessing the temperature of various regions of a scene imaged by the Infrared detector.

Figure 3:
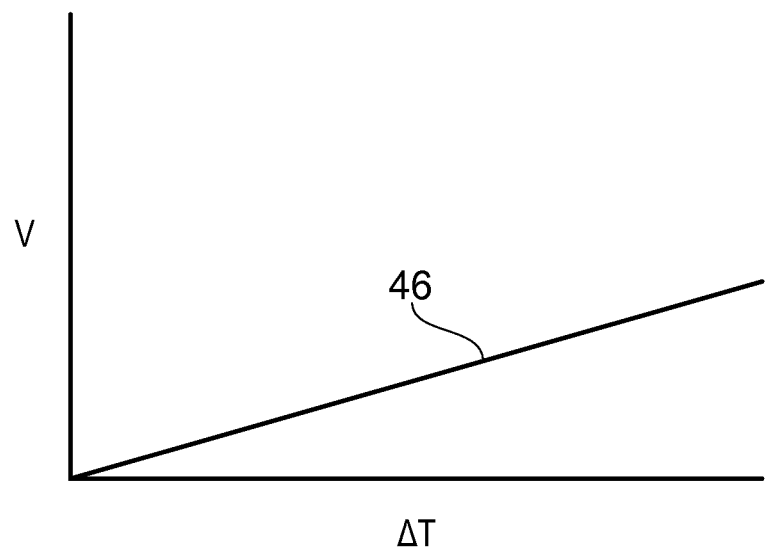
FIG. 3 is a graph showing the output voltage of a thermocouple versus temperature difference between its "hot" and "cold" junctions.
Figure 4:
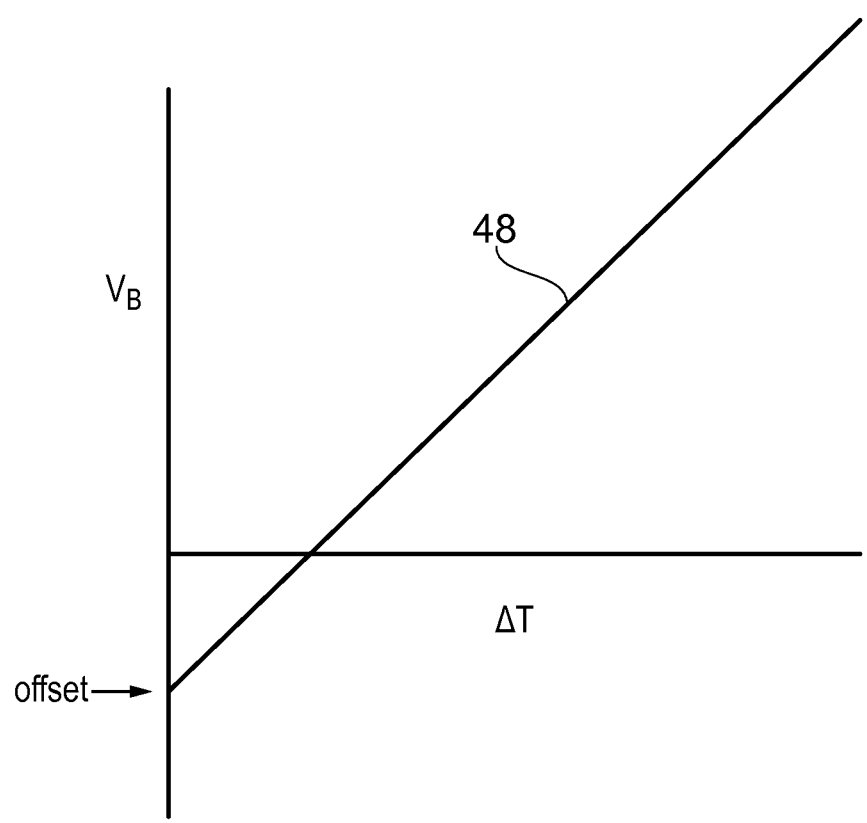
FIG. 4 is a graph showing an example of an output from a network of temperature dependent resistors in a Wheatstone bridge configuration as a function of temperature difference between first and second sides of the bridge.

FIGS. 3 and 4 show illustrative plots of thermocouple output voltage 46 and Wheatstone bridge output voltage 48 (for a bridge as described with respect of FIG. 1), respectively, as a function of the temperature difference $\Delta T$ between the temperature of the platform 22 and the temperature of the substrate 24, where R2 and R3 are assumed to be held at the temperature of the substrate.

It can be seen that the output voltage from the thermocouple 40 is, to a first approximation, linear with respect to temperature difference. However if more accuracy is required the output voltage can be described by a more complex polynomial, although this can often be ignored for the relatively small temperature differences experienced in an infrared imaging array.

By contrast, because of the comparative nature of the Wheatstone bridge, any discrepancy between the resistors, even as a result of small imperfections in the masking or etching steps, can result in relatively large offsets occurring at $\Delta T=0$.

FIG. 4 also shows that the sensitivity of temperature dependant resistors can be significantly greater than that of the thermocouple 40, as demonstrated by the steeper gradient of the curve 48, and this greater output voltage sensitivity can provide a better performance when in the presence of noise from subsequent signal processing circuitry. The inherent signal to noise ratios of temperature dependent resistors and thermocouples can be expected to be substantially the same.

Figure 5A:
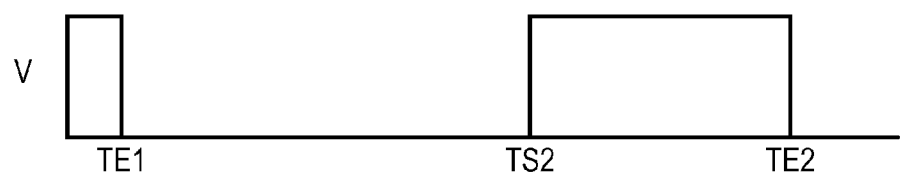
FIGS. 5a to 5c are timing diagrams showing an interrogation signal supplied to a Wheatstone bridge that includes temperature dependent resistors; the evolution of resistance with respect to time following application of the interrogation signal; and output from the bridge with respect to time, respectively.
Figure 5B:
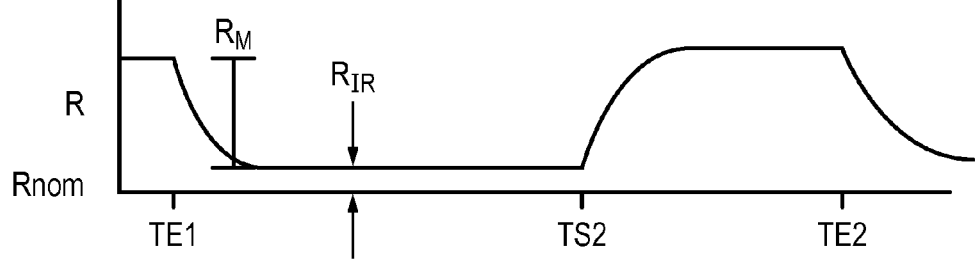

FIGS. 5a and 5b are timing diagrams showing the evolution of the resistance of the temperature dependant resistors R1 and R4 with respect to time, as shown in FIG. 5b, in response to a measurement excitation signal, as shown in FIG. 5 a.

The measurement excitation signal can be provided in a time multiplexed manner, and may be conveniently represented as a square wave. FIG. 5a shows a time span where a first excitation comes to an end at TE1, and then no excitation is supplied until TS2 when a second excitation signal is commenced. The second excitation signal remains asserted until time TE2 when it is removed.

The measurement excitation signal can be a controlled, and advantageously fixed voltage or a fixed current—depending on the sign of the resistor TCR.

FIG. 5b schematically shows the evolution of the resistance for a resistor having a positive TCR during the measurement cycle. In order to show the feature of interest, the origin of FIG. 5b has been suppressed such that "zero" of the ordinate corresponds to a nominal resistance, Rnom, of the temperature dependent resistor R1 (or R4) at the prevailing ambient temperature. The resistance of R1 varies from its nominal value Rnom by an additional amount $R_{IR}$ resulting from heating of the resistor due to the infrared radiation impinging on it. Additionally once the excitation signal is applied for the purpose of measuring the value of Rnom+$R_{IR}$, the Joule heating of the resistors due to the current flow causes an additional temperature rise that manifests itself as an additional resistance component Rm.

Figure 5C:
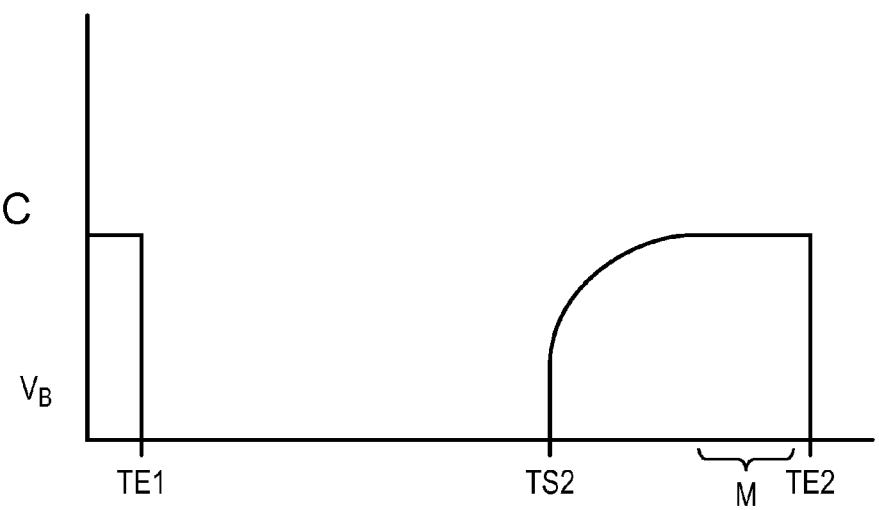

As measurements of the resistance can only be taken whilst the excitation signal is applied, then an additional settling time needs to be allowed whilst the temperature dependent resistor R1 (or R1 and R4) warms to a new value. Measurements are made by sampling the output voltage of the bridge VB in a measurement window M that precedes TE2, as shown in FIG. 5c.

Thus the resistance as measured by the exposed pixel in the active array, for example of R1 is the sum of Rnom, $R_{IR}$ and Rm for R1. For the corresponding obscured resistor in the reference array, the value is Rnom+Rm. Thus the additional resistance $R_{IR}$ should occur in an arm of the bridge in which the resistor R1 is located and give rise to a measurable voltage difference across the bridge.

During the period between TE1 and TS2, the pixel 20, or more accurately the platform 22 thereof, can cool to a temperature which substantially corresponds to the ambient temperature summed with an additional temperature due to the impinging infrared radiation. This temperature difference compared to that of the substrate 24 can be measured from the thermocouple 40 directly—without needing to supply any excitation signal. The data from the thermocouple can be collected during the period when the bolometer (which may comprise the resistors R1 to R4) is not being subjected to Joule heating, so as to estimate the temperature of pixel 20. Additionally or alternatively measurements can be made whilst the resistors of the bolometer are energised, for example during the measurements window M.

Since the performance of the thermocouple is substantially irrespective of scaling errors and related only to temperature difference along conductors formed by the cooperating materials having differing Seebeck coefficients, then for each pixel the output of the thermocouple, Vthermo, is substantially directly proportional to the additional heating due to the impinging IR radiation.

The designer can assume that to a first approximation, a direct relationship exists between the thermocouple output voltage and the output voltage of the Wheatstone bridge, so ideally $$Vbridge = A \cdot Vthermo$$

where A is a scaling coefficient.

However, if there is an offset Voff, then the offset can be estimated on a pixel by pixel basis as $$Voff = Vbridge - A \cdot Vthermo$$

Once the offset is estimated, it can be used to modify the output signal from the Wheatstone bridge so that all pixels give substantially the same output when viewing a uniform scene. An estimate of offset across the array can be made during manufacture (or later) by using the array to image a target at a uniform temperature. Advantageously, but not necessarily, the uniform temperature is known and well controlled such that gain errors can also be measured on a pixel by pixel basis and correction factors calculated and stored in a memory. The memory may be a non-volatile memory. The memory may include a look up table.

In fact, it can also be seen that if the current flowing through the temperature sensitive resistor(s), or the Wheatstone bridge arrangement is varied between first and second levels, for example by supplying the current from a controllable current source then not only can the offset for the temperature dependent resistors be estimated, but also the gradient of the slope, thereby allowing for gain/slope error corrections to be made. Thus, the temperature sensitive resistor(s) R1 or R1 to R4 can be used as its or their own heater.

Alternatively, a heating element such as a polysilicon resistor may also be formed on the platform 22 such that a known amount of energy can be supplied to the platform 22 to provide an additional temperature rise to the platform for gain calibration purposes. This approach can avoid the need to supply a more complex drive signal to the arrays of pixels.

Figure 6:
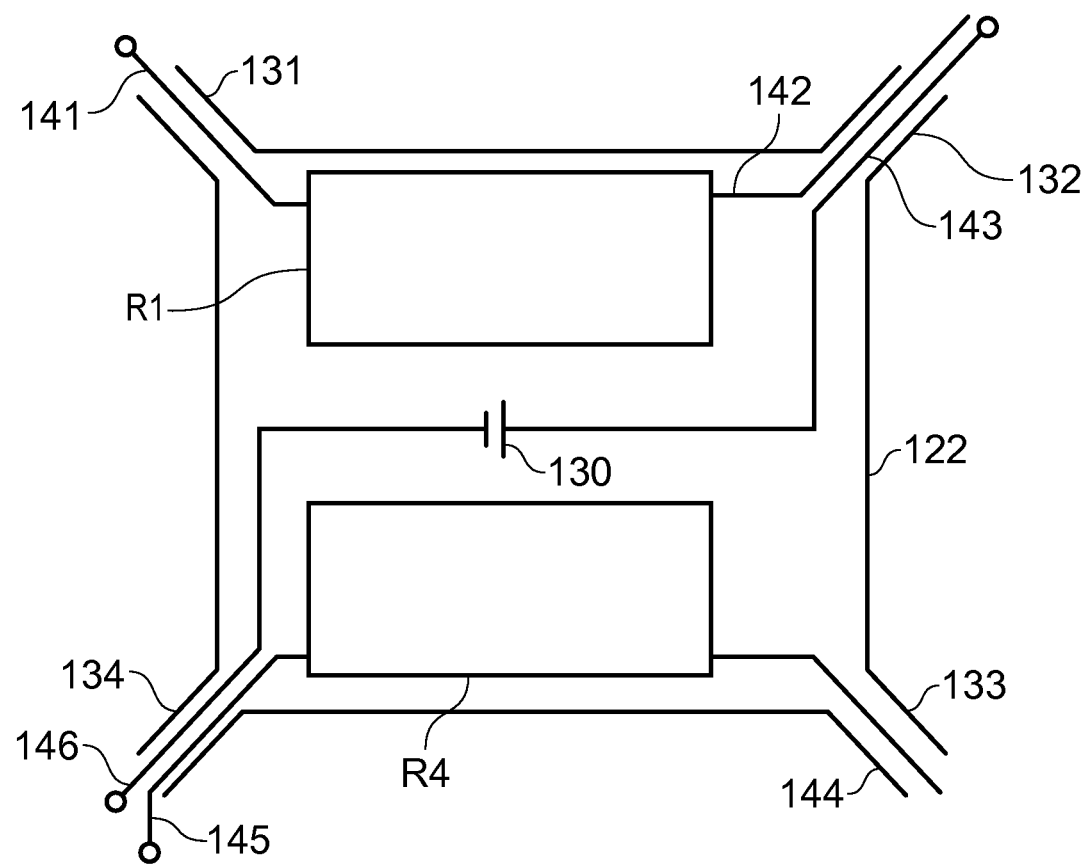
FIG. 6 is a plan view of an embodiment of a platform showing the positions of components on the platform and the connections made to those components.

FIG. 6 shows a further embodiment of a pixel fabricated on a platform 122. The platform 122 carries two temperature dependent resistors R1 and R4, and a thermocouple 130. The platform 122 has, in this instance, four legs 141 to 144 and connections between the substrate and the components on the platform 122 are made by depositing conductors onto the legs.

Thus, in this example, the first leg 131 carries a first conductor 141 of a first material connecting with a first terminal of R1, which can be formed as a meandering track (so as to increase path length and hence resistance) of the first material. A second conductor 142 of the first material connects with a second terminal of the resistor R1 and passes along the second leg 132. The second leg 132 also, in this example, carries a third conductor 143 formed of, for example, p-type polysilicon which connects with a dissimilar conductor to form the thermocouple 130. The third leg 133 carries a fourth conductor formed of the first material which connects to a first end of resistor R4 which like R1 is formed of a meandering track of the first material. The fourth leg 134 carries a fifth conductor 145 made of the first material which is connected to a second terminal of the fourth resistor R4, and a sixth conductor 146 made of, for example n-type polysilicon which forms a junction with third conductor 143, thereby forming thermocouple 130. It may be advantageous for junction of the thermocouple 130 to be formed close to leg 132 and for conductor 146 to return back along leg 132. As these materials exhibit dissimilar Seebeck coefficients, then a temperature difference between the hot and cold ends of the conductors will give rise to a voltage difference. The first material may be a metal or a semiconductor, and may without limitation be platinum, tungsten, amorphous silicon, or SiGe. The second material is different from the first material, but may be selected from the list discussed above.

Figure 7:
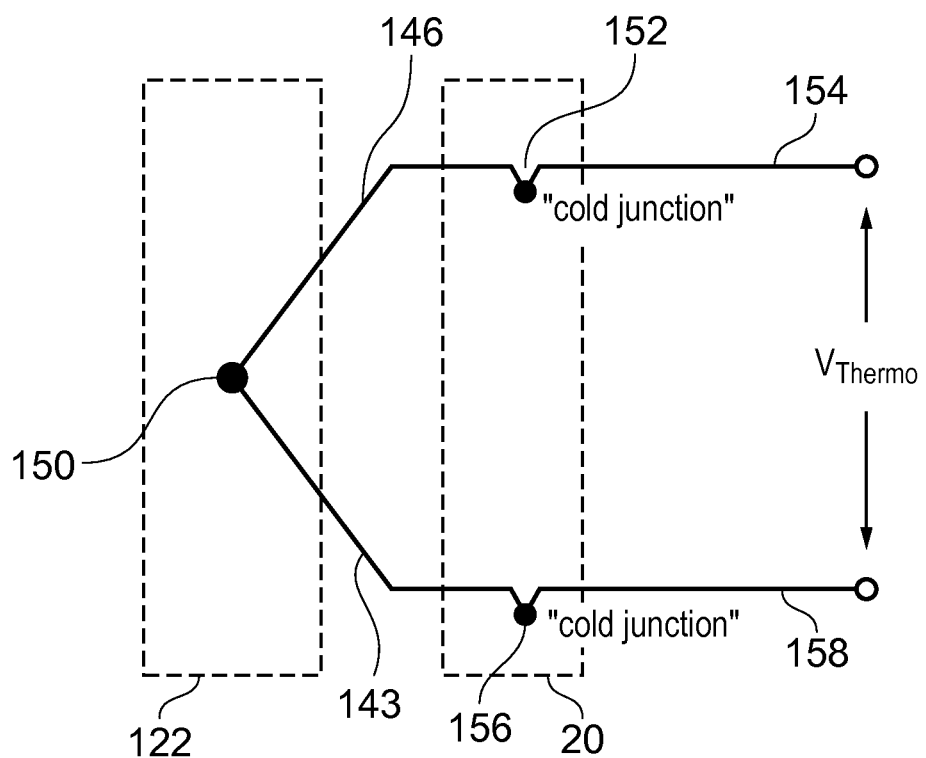
FIG. 7 is a circuit diagram of a thermocouple circuit, correlating junction positions with parts of an exemplary embodiment of the invention.

FIG. 7 is a circuit diagram showing the thermocouple 130 of FIG. 6 in greater detail, and schematically showing a first junction 150, which acts as a hot junction between the n-type polysilicon conductor 146 and the p-type polysilicon conductor 143. In this configuration two cold junctions exist on the substrate 24. A first cold junction 152 is formed between the n-type polysilicon 146 and a first further conductor, such as an Aluminium conductor 154. A second cold junction 156 occurs between the p-type polysilicon conductor 143 and a second further conductor 158 which is (or should be) made of the same material as the first further conductor 154. This gives rise to a thermocouple where a temperature difference between the platform 122 and the substrate 20 gives rise to a thermocouple output voltage Vthermo.

If the response, i.e. the resistance of an illuminated resistor R1, R4 or voltage developed across it, can be estimated for a given input illumination (in terms of flux density and spectral content) then it becomes possible to dispense with the bridge arrangement, and for example, replace it with a single temperature dependent resistor and a thermocouple or a thermopile on the platform 22, and provide the voltage developed across the temperature dependent resistor to an input of an amplifier, such as a differential amplifier, or to an analog to digital converter.

A second input of the amplifier can receive a signal that represents the corrected voltage across the temperature dependent resistor at a predetermined temperature. The predetermined temperature may be variable such that a measurement from one or more notional or actual ambient temperatures may serve as a temperature reference.

Figure 8:
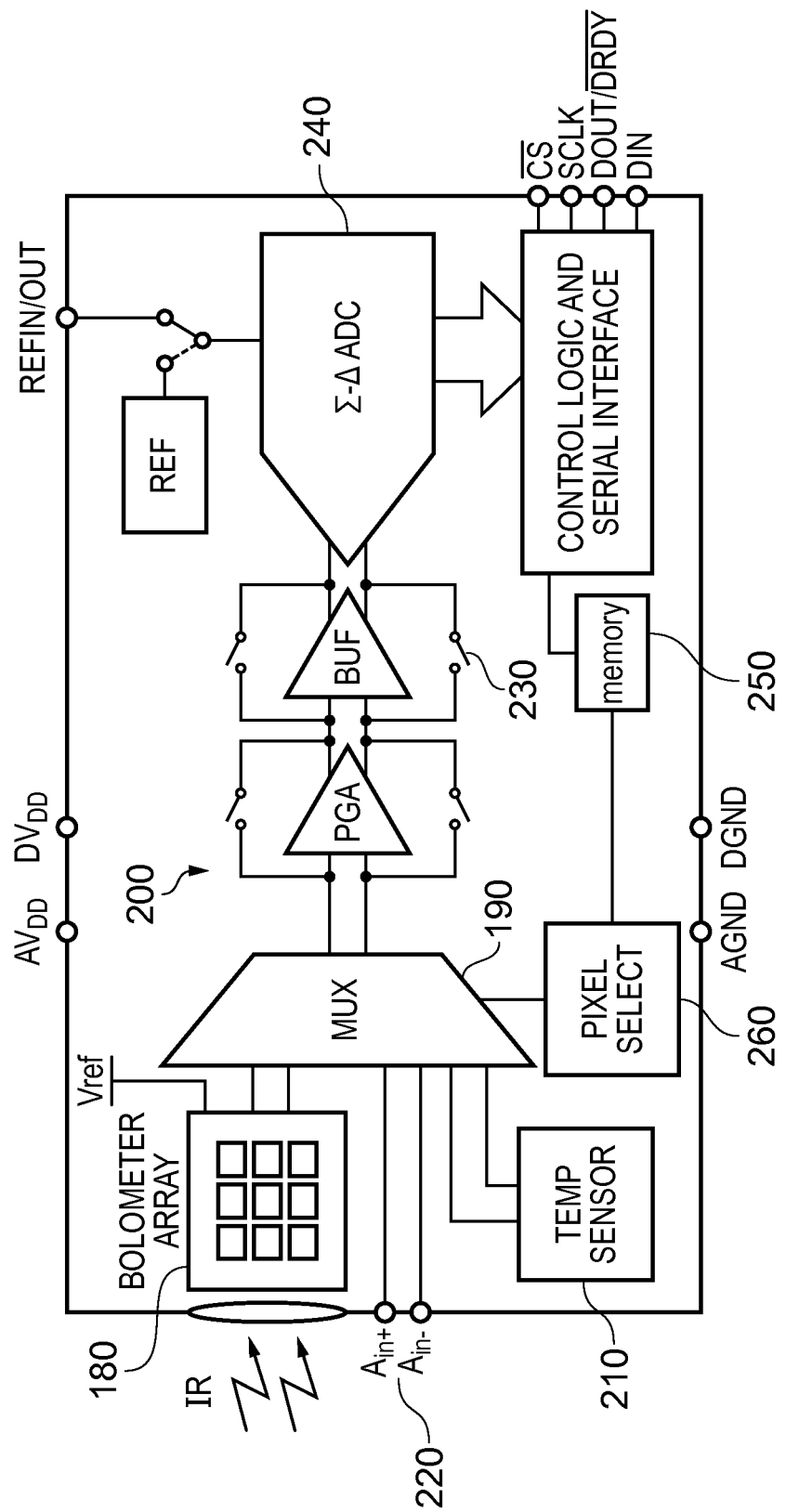
FIG. 8 is a block diagram of an IR sensor array in conjunction with signal processing amplifiers and an analog to digital converter.

An example of such an arrangement is shown in FIG. 8, where a plurality of pixels are provided in an array 180. More detail will be provided with reference to FIG. 10. Returning to FIG. 8, an individual one of the pixels can be selected by a multiplexer 190 for connection to a first input of a programmable gain differential amplifier 200. Similarly a reference from an internal temperature sensor 210 or an external reference input 220 can be selected by the multiplexer 190 and provided to a second input of the amplifier 200. The output of the amplifier may then be buffered by a buffer 230, and the output digitized by an analog to digital converter (ADC) 240. The analog to digital converter 240 may be a sigma-delta converter as shown in FIG. 8, or could be a different ADC technology, such as, without limitation, a switched-capacitor ADC.

Pixel by pixel correction values can be stored, in a pixel correction memory 250 responsive to a pixel selector 260, such that for a selected pixel the output from the analog to digital converter 240 can be modified by data stored in the pixel correction memory, such that offset correction, gain correction or a combination of offset and gain correction can be performed using data derived from the thermocouple fabricated as part of each pixel.

The differential amplifier 200 can perform gain and offset (resistance) compensation prior to signal processing, for example by analog to digital conversion, and may be provided in combination with a signal integrator in order to reduce the noise bandwidth at the input of the analog to digital converter 240 and also possibly to provide additional gain.

Thus the provision of a thermocouple provides a simple way of compensating for manufacturing tolerances in the temperature sensitive resistors.

The multiplexer 190 can be used to select the temperature dependent resistors or the thermocouple of each pixel. Thus periodic re-checking of the resistor output characteristic can be performed against the signal from the thermocouple. Preferably this is done when the scene is only slowly changing, or when it can be deduced that several pixels are observing the same object.

In some embodiments of the invention a resistor, for example of polysilicon may also be fabricated on the platform 122 such that by applying a known amount of energy (or a known power) known amounts of heat, which manifest as known increases in temperature (either by calculation or by measurement with the thermocouple), can be added to either the pixels used to monitor a scene, or to the reference resistors used. This enables, for example, code changes in the output of the analog to digital converter 240 to be validated against known heating in order to provide gain change information for the buffer amplifier 200.

The reference array may also have thermocouples formed on it such that thermal gradients across the array can be detected and compensated for. Such gradients may arise from the positioning of additional components around the array. For example, when positioned in a customer's product, power switches or other "warm" devices may be positioned, possibly inadvertently or because of packaging requirements, sufficiently close to the array to cause a temperature gradient to develop across it. Similarly environmental factors in the device when deployed in the field could also give rise to thermal gradients across a spatially expansive infrared detector. These gradients may affect the temperature of the substrate. In such a scenario the outputs of the thermocouples in the reference array vary with position whereas they would normally be expected to all give the same output. This information can be used to provide gain or offset correction.

Figure 9:
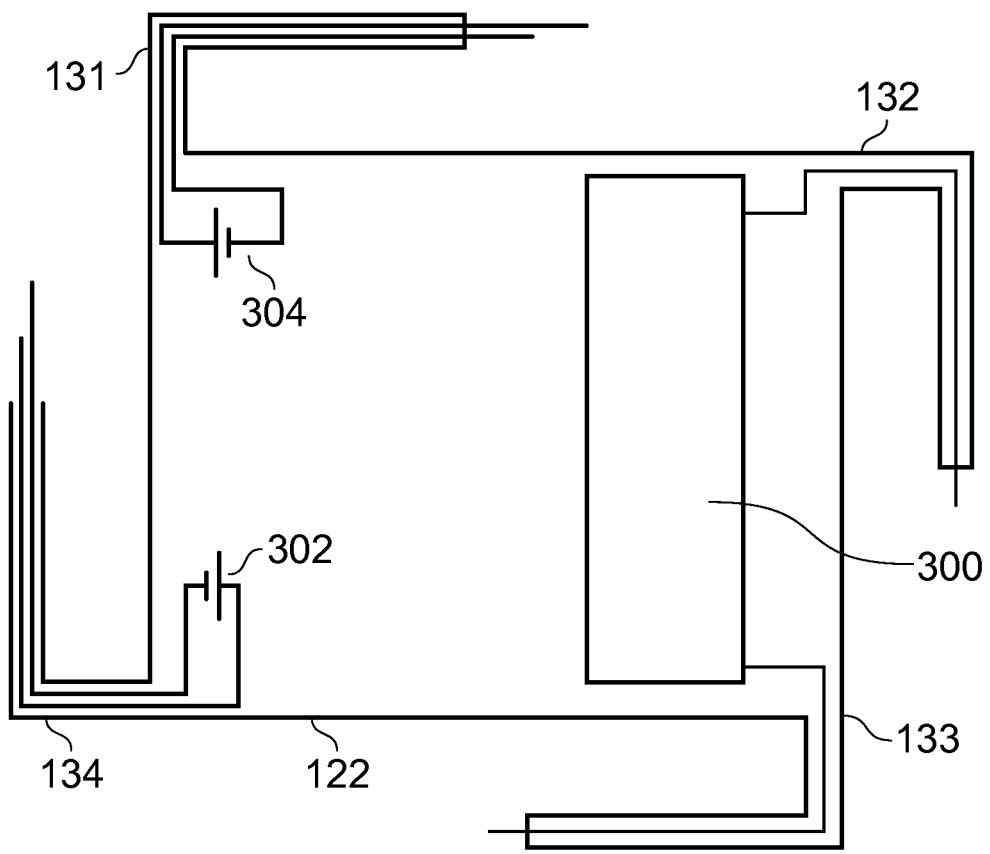
FIG. 9 is a plan view of a further embodiment of a platform.

FIG. 9 shows a modified platform 122, compared to the platform of FIG. 6. The modified platform 122 has only one resistor 300 fabricated on the platform 122. Additionally, in this example, two thermocouples 302 and 304 have been provided on the platform 122. The two dissimilar conductors used to form the thermocouple 304 can be formed on the first leg 131 of the platform 122. Similarly the two dissimilar conductors used to form the thermocouple 302 can be formed on the leg 134 of the platform. The thermocouples 302 and 304 can be connected in series, thereby forming a thermopile, so as to provide an enhanced output voltage. Conductive tracks to the resistor 300 may be formed on legs 132 and 133. As, in this example, only one resistor 300 has been formed by the provision of a meandering track on the platform 122, the resistor 300 can be formed over a bigger surface area if desired. Such a resistor 300 can have a larger resistance for a given track width.

Figure 10:
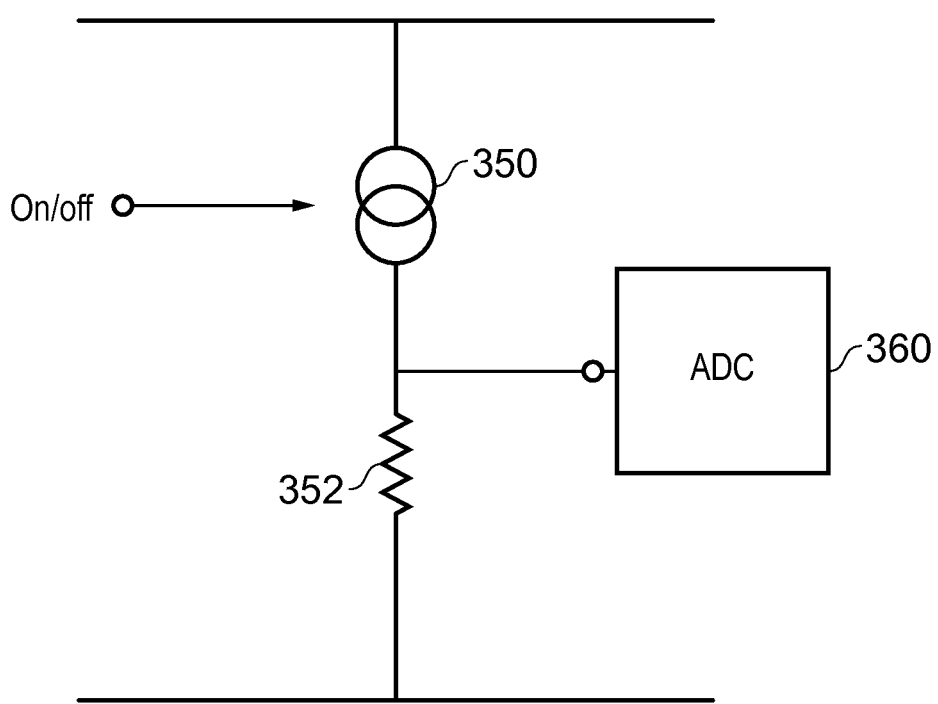
FIG. 10 shows a pixel having a single temperature sensitive resistor in combination with a drive circuit.

Wheatstone bridge arrangements are not the only way of detecting changes in resistance of a resistor. With the advent of highly controllable electronic circuits, as shown in FIG. 10, it is possible to measure resistance by, for example, using a controllable current source 350 to supply current through a temperature dependent resistor 352. The voltage across the resistor may then be processed, for example by being digitized by an ADC 360, which may be single ended or differential. The ADC 360 may receive a signal from an input stage (not shown) comprising an operational amplifier arranged to form a difference between the voltage across the resistor 352 and a reference voltage. The reference voltage may be formed by a substantially identical current source and resistor combination shielded from incoming infrared radiation. The circuit arrangement shown in FIG. 10 can be used in conjunction with the arrangement of FIG. 9, or any of the other embodiments described herein.

The platforms need not be limited to having four legs. For example it is possible to provide a platform with fewer than four legs. In such an example legs 132 and 134 could be omitted. Conductors coupled to the resistor 300 may be provided on legs 133 and 131 and conductors for thermocouple 302 supported by leg 133. Reducing the number of legs can reduce the thermal path between the platform 122 and the substrate.

The provision of a second IR thermal sensor, such as a thermocouple can achieve an enhanced performance within a solid-state environment, and can remove the need to provide moving parts in order to perform occasional gain and/or offset correction.

In the embodiments described above, infrared sensors were described in conjunction with particular embodiments. It will be understood, however, that the principles and advantages of the embodiments can be used for any other systems, apparatus, or methods with a need for infrared sensors and/or capturing images.

Such methods, systems, and/or apparatus can be implemented into various electronic devices. Examples of the electronic devices can include, but are not limited to, consumer electronic products, parts of the consumer electronic products, electronic test equipment, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

The claims have been drafted in single dependency format suitable for filing in the United States of America. However, for other jurisdictions where multiple dependency claims are normal, it is to be assumed that each dependent claim may depend on any preceding dependent claim of the same type, unless such a combination is clearly not feasible.

The invention claimed is:

1. An infrared sensor comprising at least one pixel comprising a first sensor and a second sensor, and wherein the first and second sensors are dissimilar, in which the first sensor comprises at least one temperature dependent resistor, and in which a time multiplexed interrogation signal is applied to the at least one pixel, and the first sensor of the at least one pixel is read while the interrogation signal is asserted, and the second sensor of the at least one pixel is read while the interrogation signal is substantially not asserted.

2. An infrared sensor as claimed in claim 1, further comprising electronic circuitry arranged to use an output of the second sensor to correct for an offset within the output of the temperature dependent resistor.

3. An infrared sensor as claimed in claim 2, in which the electronic circuitry is further configured to compensate for at least one of a gain error and a sensitivity error within the temperature dependent resistor.

4. An infrared sensor as claimed in claim 2, in which the infrared sensor comprises a plurality of pixels, and the electronic circuitry is configured to correct for offset differences among the plurality of pixels.

5. An infrared sensor as claimed in claim 1, in which the first sensor comprises first and second temperature dependent resistors which, in use, are connected to similar resistors in a Wheatstone bridge configuration.

6. An infrared sensor as claimed in claim 5, further comprising a pixel correction memory which stores pixel offset corrections for correcting a pixel output value.

7. An infrared sensor as claimed in claim 1, further comprising circuitry configured to compare the output of the first sensor to a reference value, and in which a result of the comparison is indicative of the infrared radiation impinging on the first sensor.

8. An infrared sensor as claimed in claim 1, in which an output of the first sensor has a different response to a change in temperature than an output of the second sensor.

9. An infrared sensor as claimed in claim 1, in which the second sensor comprises at least one thermocouple.

10. A method of compensating for pixel to pixel variation in an array of pixels, wherein each pixel of the array comprises a first sensor and a second sensor dissimilar to the first sensor, wherein the first sensor comprises at least one temperature dependent resistor and the second sensor comprises at least one thermocouple, and wherein the method comprises: reading the thermocouple and the at least one temperature dependent resistor at different points in time; and comparing the outputs of the first and second sensors to identify at least offset errors in the output of the first sensor.

11. A method as claimed in claim 10, in which the thermocouple is read whilst substantially no current or voltage is supplied to read the associated at least one temperature dependent resistor.

12. A method as claimed in claim 11, further comprising calibrating the array of pixels by viewing a reference object that has a substantially uniform temperature.

13. A method as claimed in claim 10, further comprising supplying additional heating to a pixel in the array of pixels to cause a known temperature change therein and assessing a gain or a sensitivity of the pixel.

14. A method as claimed in claim 13, in which the array of pixels is configured to be exposed to impinging infrared radiation, and the additional heating is applied to pixels of the array.

15. An infrared sensor comprising:
a pixel comprising a first sensor and a second sensor, the first sensor comprising a temperature dependent resistor, and the second sensor comprising a thermocouple; and
electronic circuitry configured to obtain data associated with the temperature dependent resistor and data associated with the thermocouple at different points in time, and to detect an offset error in the data associated with the temperature dependent resistor based on the data associated with the temperature dependent resistor and the data associated with the thermocouple.

16. An infrared sensor as claimed in claim 15, further comprising a heater configured to warm the pixel.

17. An infrared sensor as claimed in claim 15, further comprising a pixel correction memory which stores pixel offset correction values for correcting a pixel output value.

18. An infrared sensor as claimed in claim 15, wherein the first sensor further comprises a second temperature dependent resistor, and wherein the temperature dependent resistor and the second temperature dependent resistor, in use, are connected to resistors arranged in a Wheatstone bridge configuration.

19. An infrared sensor as claimed in claim 15, wherein the electronic circuitry is configured to obtain the data associated with the temperature dependent resistor while the pixel is heated and to obtain the data associated with the thermocouple while the pixel is not substantially heated.

20. An infrared sensor as claimed in claim 15, wherein the infrared sensor comprises a plurality of pixels that include the pixel, and wherein the electronic circuitry is configured to correct for offset differences among the plurality of pixels.

* * * * *